(12) United States Patent
Choi et al.

(10) Patent No.: US 12,482,764 B2
(45) Date of Patent: Nov. 25, 2025

(54) SEMICONDUCTOR PACKAGE INCLUDING POWER PLANE CONNECTING POWER TERMINAL OF PASSIVE DEVICE UNIT AND DUMMY BUMP OF INTERPOSER

(71) Applicant: SAMSUNG ELECTRONICS CO., LTD., Suwon-si (KR)

(72) Inventors: Juyoun Choi, Hwaseong-si (KR); Miyeon Kim, Hwaseong-si (KR); Jungil Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 576 days.

(21) Appl. No.: 17/875,639

(22) Filed: Jul. 28, 2022

(65) Prior Publication Data

US 2023/0154866 A1 May 18, 2023

(30) Foreign Application Priority Data

Nov. 16, 2021 (KR) .................. 10-2021-0158036

(51) Int. Cl.
*H01L 23/00* (2006.01)
*H01L 23/14* (2006.01)
(Continued)

(52) U.S. Cl.
CPC ...... *H01L 23/562* (2013.01); *H01L 23/49827* (2013.01); *H01L 23/49838* (2013.01);
(Continued)

(58) Field of Classification Search
CPC ............. H01L 25/0657; H01L 25/0652; H01L 23/5383; H01L 23/49822; H01L 23/147;
(Continued)

(56) References Cited

U.S. PATENT DOCUMENTS 8,716,855 B2  5/2014  Chi et al.
9,059,084 B2  6/2015  Sugimoto et al.
(Continued)

FOREIGN PATENT DOCUMENTS

KR    10-2015-0065162 A    6/2015

OTHER PUBLICATIONS

Moon et al., "System-level Power Integrity Optimization Based on High-Density Capacitors for enabling HPC/AI applications", 2020 IEEE Electron Devices Technology and Manufacturing Conference Proceedings of Technical Papers, 5 pages.
(Continued)

*Primary Examiner* — Sonya McCall-Shepard
(74) *Attorney, Agent, or Firm* — Morgan, Lewis & Bockius LLP

(57) ABSTRACT

A semiconductor package includes a package base substrate including a potential plate. An interposer is arranged on the package base substrate and comprises at least one interposer through electrode, at least one first connection bump, and at least one second connection bump. A first stacked chip unit is arranged on the interposer and comprises a first semiconductor chip and at least one second semiconductor chips arranged on the first semiconductor chip. At least one passive device unit is arranged on the package base substrate. The at least one passive device unit is spaced apart from the interposer in a horizontal direction parallel to an upper surface of the package base substrate. The at least one first connection bump is a dummy bump. The potential plate electrically connects the at least one first connection bump and a power terminal of the at least one passive device unit to each other.

20 Claims, 6 Drawing Sheets

(51) Int. Cl.
*H01L 23/498* (2006.01)
*H01L 23/538* (2006.01)
*H01L 25/065* (2023.01)
*H01L 25/18* (2023.01)

(52) U.S. Cl.
CPC .......... *H01L 24/14* (2013.01); *H01L 25/0652* (2013.01); *H01L 25/0657* (2013.01); *H01L 25/18* (2013.01); *H01L 2224/14517* (2013.01); *H01L 2225/06513* (2013.01); *H01L 2225/06517* (2013.01); *H01L 2225/06541* (2013.01); *H01L 2225/06548* (2013.01); *H01L 2225/06589* (2013.01); *H01L 2924/1205* (2013.01); *H01L 2924/1431* (2013.01); *H01L 2924/1434* (2013.01); *H01L 2924/3511* (2013.01)

(58) Field of Classification Search
CPC . H01L 2224/16227; H01L 2224/73204; H01L 2224/81192; H01L 2225/06513; H01L 2225/06517; H01L 24/05; H01L 24/13; H01L 24/14; H01L 24/16; H01L 24/17; H01L 2224/97; H01L 2221/68331; H01L 23/5384; H01L 2225/06541; H01L 24/81; H01L 2224/0401; H01L 2224/04105; H01L 2224/08235; H01L 2224/12105; H01L 2224/16146; H01L 2224/16235; H01L 2224/16238; H01L 23/3128; H01L 2224/73259; H01L 2924/15311; H01L 2924/18161; H01L 2924/182; H01L 23/562; H01L 2924/3511; H01L 23/49827; H01L 2224/14517; H01L 2225/06548; H01L 23/49816; H01L 23/5385; H01L 2225/06568

See application file for complete search history.

(56) References Cited

U.S. PATENT DOCUMENTS

| | | | |
|---|---|---|---|
| 9,406,648 | B2 | 8/2016 | Wang et al. |
| 9,478,474 | B2 | 10/2016 | Chen et al. |
| 9,735,082 | B2 * | 8/2017 | Hung ................ H01L 23/49822 |
| 10,453,821 | B2 | 10/2019 | Lee et al. |
| 10,535,633 | B2 * | 1/2020 | Wei ........................ H01L 25/18 |
| 10,818,632 | B1 | 10/2020 | Ramachandran et al. |
| 11,018,121 | B2 | 5/2021 | Jeong et al. |
| 11,081,426 | B2 | 8/2021 | Mohamed et al. |
| 2016/0035656 | A1 * | 2/2016 | Haba ................... H01L 25/0657 257/690 |
| 2018/0254260 | A1 | 9/2018 | Wei et al. |
| 2020/0161275 | A1 * | 5/2020 | Lin ...................... H01L 23/5384 |
| 2020/0273809 | A1 * | 8/2020 | Liu ...................... H03B 5/1228 |

OTHER PUBLICATIONS

Office Action dated Aug. 26, 2025 issued in corresponding Korean Patent Application No. 10-2021-0158036.

* cited by examiner

SEMICONDUCTOR PACKAGE INCLUDING POWER PLANE CONNECTING POWER TERMINAL OF PASSIVE DEVICE UNIT AND DUMMY BUMP OF INTERPOSER

CROSS-REFERENCE TO RELATED APPLICATION

This application claims priority under 35 U.S.C. § 119 to Korean Patent Application No. 10-2021-0158036, filed on Nov. 16, 2021 in the Korean Intellectual Property Office, the disclosure of which is incorporated by reference in its entirety herein.

1. TECHNICAL FIELD

Embodiments of the present inventive concept relate to a semiconductor package, and more particularly, to a semiconductor package including a plurality of stacked semiconductor chips.

2. DISCUSSION OF RELATED ART

Generally, in instances in which semiconductor chips are formed by performing several semiconductor processes on a wafer, a packaging process may be performed to form a semiconductor package. The semiconductor package may include a semiconductor chip, an interposer on which the semiconductor chip is mounted, and a bonding wire or bump that electrically connects the semiconductor chip to the interposer. Commercial demand has increased for semiconductor packages having a high integration level and an increased reliability and process capability.

SUMMARY

Embodiments of the present inventive concept provide a semiconductor package having increased reliability.

For example, embodiments of the present inventive concept provide a semiconductor package with reduced power inductance and increased power integrity.

According to an embodiment of the present inventive concept, a semiconductor package includes a package base substrate including a potential plate. An interposer is arranged on the package base substrate and comprises at least one interposer through electrode, at least one first connection bump, and at least one second connection bump. A first stacked chip unit is arranged on the interposer and comprises a first semiconductor chip and at least one second semiconductor chips arranged on the first semiconductor chip. At least one passive device unit is arranged on the package base substrate. The at least one passive device unit is spaced apart from the interposer in a horizontal direction parallel to an upper surface of the package base substrate. The at least one first connection bump is a dummy bump. The potential plate electrically connects the at least one first connection bump and a power terminal of the at least one passive device unit to each other.

According to an embodiment of the present inventive concept, a semiconductor package includes a package base substrate including a potential plate. An interposer is arranged on the package base substrate and comprises at least one interposer through electrode, at least one first connection bump, and at least one second connection bump. A first stacked chip unit is arranged on the interposer and comprises a first semiconductor chip and at least one second semiconductor chip arranged on the first semiconductor chip. A second stacked chip unit is arranged on the interposer and comprises at least one third semiconductor chip arranged to be spaced apart from the first stacked chip unit in a horizontal direction parallel to an upper surface of the package base substrate. A plurality of passive device units is arranged on the package base substrate and is arranged to be spaced apart from the first stacked chip unit and the second stacked chip unit in the horizontal direction. The interposer comprises a plurality of interposer through electrodes that vertically penetrate the interposer. The at least one first connection bump is a dummy bump. In a plan view, the plurality of passive device units surround the at least one first connection bump. The potential plate electrically connects the at least one first connection bump and a power terminal of the plurality of passive device units to each other.

According to an embodiment of the present inventive concept, a semiconductor package includes a package base substrate comprising a plurality of interconnection layers. An interposer is arranged on the package base substrate and comprises a plurality of interposer through electrodes, a plurality of first connection bumps, and a plurality of second connection bumps. A first stacked chip unit is arranged on the interposer and comprises a first semiconductor chip and at least one second semiconductor chip arranged on the first semiconductor chip. A second stacked chip unit is arranged on the interposer and comprises at least one third semiconductor chip arranged to be spaced apart from the first stacked chip unit in a horizontal direction. A plurality of passive device units is arranged on the package base substrate and is arranged to be spaced apart from the first stacked chip unit and the second stacked chip unit in the horizontal direction. The plurality of interposer through electrodes and the plurality of second connection bumps are electrically connected to each other. Each of the plurality of first connection bumps is a dummy bump. The first semiconductor chip comprises a buffer chip that controls the second semiconductor chip. The at least one second semiconductor chip comprises a memory cell chip. The at least one third semiconductor chip comprises a memory cell chip and a logic chip. Each of the plurality of passive device units comprises a capacitor. In a plan view, the plurality of passive device units surrounds the plurality of first connection bumps. The plurality of first connection bumps and the plurality of passive device units are electrically connected to each other through a potential plate of the package base substrate. The potential plate is arranged on an uppermost interconnection layer among the plurality of interconnection layers. The potential plate is arranged on a single interconnection layer. The potential plate comprises a power path.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
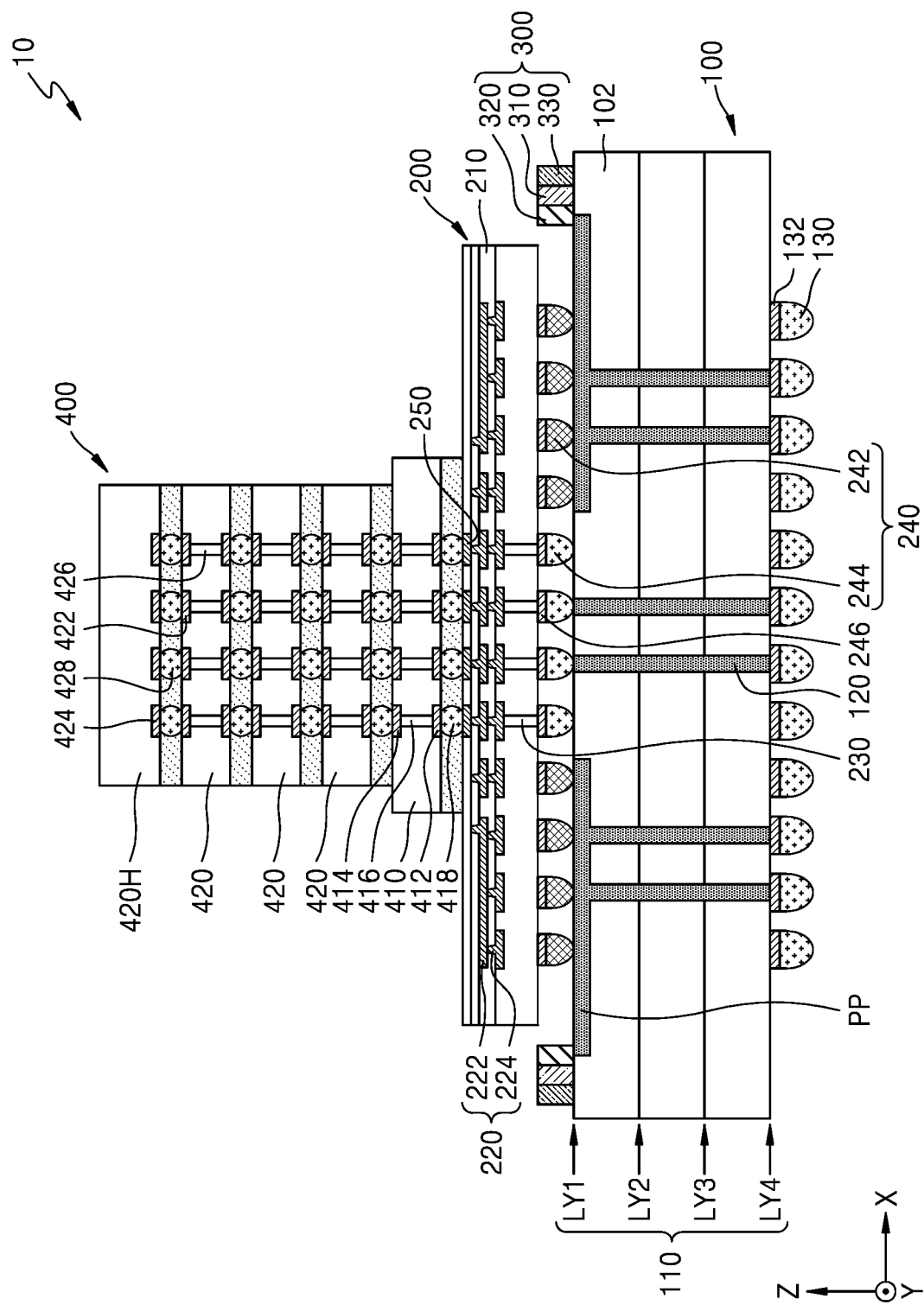
FIG. 1 is a cross-sectional view of a semiconductor package, according to an embodiment of the present inventive concept.

Hereinafter, various embodiments of the present inventive concept will be described in detail with reference to the accompanying drawings. Like components in the drawings will be referred to as like reference numerals, and will not be repeatedly described.

FIG. 1 is a cross-sectional view of a semiconductor package 10, according to an embodiment of the present inventive concept.

Referring to FIG. 1, the semiconductor package 10 according to an embodiment may include a package base substrate 100, an interposer 200, a passive device unit 300, and a first stacked chip unit 400.

The semiconductor package 10 according to an embodiment may include a power plane PP connected to a power terminal 320 of the passive device unit 300 and a first connection bump 242 of the interposer 200. The semiconductor package 10 may reduce a power inductance of the semiconductor package 10, including the power plane PP. The semiconductor package 10 according to an embodiment may also increase power integrity.

In an embodiment, the package base substrate 100 may include a base board layer 102, and a plurality of package base substrate top pads and a plurality of package base substrate bottom pads 132 which are respectively disposed on a top surface and a bottom surface of the base board layer 102. In an embodiment, the package base substrate 100 may include a plurality of first interconnection paths electrically connecting the plurality of package base substrate top pads to the plurality of package base substrate bottom pads 132 through the base board layer 102. In some embodiments, the package base substrate 100 may be a printed circuit board (PCB). The package base substrate 100 may include a plurality of interconnection layers 110. For example, the package base substrate 100 may be a multi-layer PCB. In an embodiment as shown in FIG. 1, the package base substrate 100 may include the plurality of interconnection layers 110 including a first layer LY1, a second layer LY2, a third layer L3, and a fourth layer LY4 which are located in different vertical levels.

Herein, the interconnection layers 110 may refer to a spot having a circuit interconnection forming an electrical path on the same plane. Herein, the interconnection layers 110 may refer to a spot where a signal interconnection line and/or an equal-potential plate are/is arranged. For example, on each of the plurality of interconnection layers 110, either the signal interconnection line or the equal-potential plate may be arranged, or the equal-potential plate may be arranged together with a relatively small number of signal interconnection lines. For example, in an embodiment the plurality of interconnection layers 110 may include the equal-potential plate extending in a horizontal direction in the same vertical level.

In an embodiment as shown in FIG. 1, one package base substrate 100 includes four interconnection layers 110 located in different vertical levels. However, embodiments of the present inventive concept are not necessarily limited thereto and the number of interconnection layers 110 of one package base substrate 100 may vary. For example, in an embodiment, one package base substrate 100 may include three or less or five or more interconnection layers 110 located in different vertical levels. In an embodiment in which the package base substrate 100 includes five or more interconnection layers 110, the respective interconnection layers may be referred to as the first layer LY1, the second layer LY2, the third layer LY3, the fourth layer LY4, the fifth layer LY5, etc., sequentially from the highest vertical level to the lowest vertical level.

In an embodiment, the package base substrate 100 may include a package base substrate interconnection via 120 that electrically connects the first connection bump 242 or a second connection bump 244 of the interposer 200 to the package base substrate bottom pad 132. The package base substrate interconnection via 120 may include a material that is substantially the same as, or a material that is different from, that of the power plane PP and/or an interposer through electrode 230.

In an embodiment, a ground 330 of the passive device unit 300 may be electrically connected to the first connection bump 242 or the second connection bump 244 through the interconnection layers 110 except for the first layer LY1.

In an embodiment, a thickness of each of the plurality of interconnection layers 110 may be in a range of about 5 μm to about 20 μm. Thus, a thickness of the first layer LY1 may be in a range of about 5 μm to about 20 μm. Ranges of thicknesses of the plurality of interconnection layers 110 may be different from or partially the same as one another.

The power plane PP may refer to a potential plate that connects the first connection bump 242 to the power terminal 320 of the passive device unit 300. The power plane PP may be disposed on the single interconnection layer 110 among the plurality of interconnection layers 110 of the package base substrate 100. Thus, the length of the power plane PP of the semiconductor package 10 may be reduced. For example, in an embodiment the power plane PP may be disposed on the first layer LY1 (e.g., disposed directly thereon in the Z direction). For example, in an embodiment the power plane PP may include, but is not necessarily limited to, metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., or an alloy thereof.

A general semiconductor package may include a power plane for electrically connecting a second connection bump, instead of a dummy bump, of an interposer to a power terminal of a passive device unit. To prevent the power plane from being electrically connected to a first connection bump, the power plane is disposed through at least two interconnection layers, e.g., a first layer and a second layer, such that a structure of the power plane may be relatively complex.

The semiconductor package 10 according to an embodiment of the present inventive concept may directly connect the first connection bump 242, which is a dummy bump, to the power terminal 320 of the passive device unit 300 to reduce the length of the power plane PP and relatively simplify the structure of the power plane PP. The power plane PP may also be disposed on (e.g., directly thereon) the first layer LY1 that is the interconnection layer 110 located at the top of the package base substrate 100, thus reducing the length of the power plane PP.

In some embodiments, the interposer 200 may be a silicon (Si) interposer or a redistribution layer (RDL) interposer. The interposer 200 may include an interposer redistribution layer. The interposer redistribution layer may include at least one redistribution insulation layer 210 and a plurality of redistribution patterns 220. The plurality of redistribution patterns 220 may include a plurality of redistribution line patterns 222 and a plurality of redistribution vias 224.

For example, the interposer redistribution layer may include the plurality of stacked redistribution insulation layers 210. In an embodiment, the redistribution insulation layer 210 may be formed of an insulating material, for example, photo-imagable dielectric (PID) resin, and may further include a photosensitive polyimide and/or an inorganic filler. However, embodiments of the present inventive concept are not necessarily limited thereto.

In an embodiment, the plurality of redistribution patterns 220 including the plurality of redistribution line patterns 222 and the plurality of redistribution vias 224 may include, but are not necessarily limited to, metals such as Cu, Al, W, Ti, Ta, In, Mo, Mn, Co, Sn, Ni, Mg, Re, Be, Ga, Ru, etc., or an alloy thereof. In some embodiments, the plurality of redistribution patterns 220 may be formed by stacking metal or an alloy thereof on a seed layer including titanium, titanium nitride, and/or titanium tungsten. In an embodiment, the plurality of redistribution patterns 220 may be formed by a plating method. For example, the plurality of redistribution patterns 220 may be formed by a plating method such as immersion plating, electroless plating, or electroplating.

In an embodiment, the plurality of redistribution line patterns 222 may be disposed on at least one of a top surface or a bottom surface of the redistribution insulation layer 210. The plurality of redistribution vias 224 may extend to be in direct contact with some of the plurality of redistribution line patterns 222 through at least one redistribution insulation layer 210. In some embodiments, at least some of the plurality of redistribution line patterns 222 may be formed with some of the plurality of redistribution vias 224 to form one body. For example, the redistribution line pattern 222 and the redistribution via 224 contacting the top surface of the redistribution line pattern 222 may form one body (e.g., one integral body).

In some embodiments, the plurality of redistribution vias 224 may have a tapered shape extending with a horizontal width decreasing from a bottom portion to a top portion. For example, the plurality of redistribution vias 224 may have a horizontal width increasing apart from the first stacked chip unit 400 in a vertical direction (e.g., a Z direction). However, embodiments of the present inventive concept are not necessarily limited thereto. For example, according to an embodiment, the plurality of redistribution vias 224 may have a tapered shape extending with a horizontal width increasing from a bottom portion to a top portion. For example, the plurality of redistribution vias 224 may have a horizontal width decreasing apart from the first stacked chip unit 400 in the vertical direction (e.g., the Z direction).

Some of the plurality of redistribution line patterns 222, which are disposed on the top surface of the interposer redistribution layer, may be referred to as a redistribution top pad 250, and some of the plurality of redistribution line patterns 222, which are disposed on the bottom surface of the interposer 200, may be referred to as an external connection pad 240. The external connection pad 240 may include the first connection bump 242 and the second connection bump 244. One interposer 200 may include a plurality of first and second connection bumps 242 and 244. A first front connection pad 412 of a first semiconductor chip 410 may be electrically connected to the redistribution top pad 250, and a package connection terminal 130 may be electrically connected to the external connection pad 240. The package connection terminal 130 may function as an external connection terminal of the semiconductor package 10. The package connection terminal 130 may electrically connect the semiconductor package 10 to the outside of the semiconductor package 10. In some embodiments, the package connection terminal 130 may be a conductive bump and/or a solder ball, etc., of a metal material including a conductive material, for example, at least any one of Sn, Ag, Cu, and Al. However, embodiments of the present inventive concept are not necessarily limited thereto.

The second connection bump 244 may be arranged in a matrix form. The first connection bump 242 may be arranged along an edge of a region where the second connection bump 244 is arranged. For example, in an embodiment, four to six first connection bumps 242 may be arranged in a first horizontal direction (an X direction) or a second horizontal direction (a Y direction) between a side of the interposer 200 and a side of an inner space defined by the second connection bump 244. However, embodiments of the present inventive concept are not necessarily limited thereto. The X and Y directions may be parallel to an upper surface of the package base substrate 100.

According to an embodiment of the present inventive concept, the interposer 200 may be replaced with a semiconductor substrate. In an embodiment, the semiconductor substrate may include Si. However, embodiments of the present inventive concept are not necessarily limited thereto. For example, in an embodiment the semiconductor substrate may include a semiconductor element such as germanium (Ge) or a compound semiconductor such as silicon carbide (SiC), gallium arsenide (GaAs), indium arsenide (InAs), and indium phosphide (InP).

The external connection pad 240 may be arranged on a portion corresponding to a bottom surface of the first semiconductor chip 410 and a portion extending from the bottom surface to the outside in the first horizontal direction (e.g., the X direction) and the second horizontal direction (e.g., the Y direction). As a result, in an embodiment the interposer 200 may rearrange the first front connection pad 412 of the first semiconductor chip 410 as an external connection pad in a wider portion than the bottom surface of the first semiconductor chip 410.

According to an embodiment of the present inventive concept, the first connection bump 242 may be a dummy bump. As the size of the interposer 200 gradually increases, the interposer 200 may include the first connection bump 242 that is a dummy bump to prevent a warpage problem of the interposer 200. The first connection bump 242 may not be electrically connected to the redistribution pattern 220 of the interposer 200. For example, the interposer through electrode 230 may not be located on the same vertical plane as the first connection bump 242. In an embodiment, the first connection bump 242 and the second connection bump 244 may include the same material.

For example, in an embodiment a diameter of the first connection bump 242 and/or the second connection bump 244 may be in a range of about 10 μm to about 100 μm. According to an embodiment of the present inventive concept, the diameter of the first connection bump 242 and a diameter of the second connection bump 244 may be the same as each other.

The passive device unit 300 may be arranged on the package base substrate 100. One semiconductor package 10 may include a plurality of passive device units 300. The passive device unit 300 may include a passive device 310, the power terminal 320, and the ground 330. In an embodiment, the passive device 310 may include a high-voltage and/or low-voltage transistor, and a resistor and/or capacitor. For example, the passive device 310 may include a multi-layer ceramic capacitor (MLCC) or a low-inductance ceramic capacitor (LICC). The passive device unit 300 may be configured to apply a constant current to first through third stacked chip units 400, 500, and 600 (FIG. 2B). In addition, the power terminal 320 of the passive device unit 300 may be configured to be electrically connected to the first connection bump 242 or the second connection bump 244 of the interposer 200 through the power plane PP.

The passive device unit 300 may be arranged such that the power terminal 320 of the passive device unit 300 is close to the interposer 200. In an embodiment in which the power terminal 320 of the passive device unit 300 is arranged relatively close to the interposer 200, the structure of the power plane PP of the semiconductor package 10 may be relatively simplified and the length of the power plane PP may be relatively reduced.

For example, in an embodiment the passive device 310 may be a decoupling capacitor. The decoupling capacitor may electrically connect the power terminal 320 to the ground 330. The decoupling capacitor may prevent large current from flowing instantly to the first to third stacked chips 400, 500, and 600 to increase the reliability of the semiconductor package 10. The decoupling capacitor may be arranged between the power terminal 320 and the ground 330.

In addition, the semiconductor package 10 may include the first stacked chip unit 400 including the first semiconductor chip 410 and a plurality of second semiconductor chips 420 on the top surface of the interposer 200.

In some embodiments, the first semiconductor chip 410 may not include a memory cell. The first semiconductor chip 410 may include a serial-parallel conversion circuit, a design for test (DFT), a joint test action group (JTAG), a test logic circuit such as memory built-in self-test (MBIST), and a signal interface circuit such as a PHY. The second semiconductor chips 420 may include a memory cell. For example, the first semiconductor chip 410 may be a buffer chip for controlling the second semiconductor chips 420.

In an embodiment, the plurality of second semiconductor chips 420 may be a volatile memory such as dynamic random-access memory (DRAM), static random-access memory (SRAM), etc., or a nonvolatile memory such as phase-change random access memory (PRAM), magneto-resistive random-access memory (MRAM), ferroelectric random-access memory (FeRAM), or resistive random-access memory (RRAM).

In some embodiments, the first semiconductor chip 410 may be a buffer chip for controlling high bandwidth memory (HBM) DRAM, and the plurality of second semiconductor chips 420 may be memory cell chips having a cell of the HBM DRAM controlled by the first semiconductor chip 410. The first semiconductor chip 410 may be referred to as a buffer chip or a master chip, and the plurality of second semiconductor chips 420 may be referred to as slave chips or memory cell chips. The first semiconductor chip 410 and the plurality of second semiconductor chips 420 stacked on the first semiconductor chip 410 may be collectively referred to HBM DRAM devices.

The first semiconductor chip 410 may include a first substrate, the plurality of first front connection pads 412, a plurality of first rear connection pads 414, a plurality of first through electrodes 416, and a first chip connection terminal 418. The second semiconductor chip 420 may include a second substrate, a plurality of second front connection pads 422, a plurality of second rear connection pads 424, a plurality of second through electrodes 426, and a second chip connection terminal 428.

In an embodiment, the first and second substrates may include Si. However, embodiments of the present inventive concept are not necessarily limited thereto. For example, in an embodiment the first and second substrates may include a semiconductor element such as Ge, or a compound semiconductor such as SiC, GaAs, InAs, and InP. The first and second substrates may have an active surface and an inactive surface opposite to the active surface.

The first and second substrates may include various kinds of individual devices on the active surface. In an embodiment, the plurality of individual devices may include various microelectronics devices, for example, a metal-oxide-semiconductor field effect transistor (MOSFET) such as a complementary metal-insulator-semiconductor transistor (CMOS) transistor, an image sensor such as a system large scale integration (LSI), a CMOS imaging sensor (CIS), etc., a micro-electro-mechanical system (MEMS), an active device and/or a passive device unit, etc.

The first and second semiconductor chips 410 and 420 may include first and second semiconductor devices formed by the plurality of individual devices. The first and second semiconductor devices may be formed on the active surfaces of the first and second substrates, and a plurality of first and second front connection pads and a plurality of first and second rear connection pads may be disposed on the active surfaces and the inactive surfaces of the first and second substrates.

In an embodiment, the first and second through electrodes 416 and 426 may be through silicon vias (TSVs) having a structure that penetrates silicon of the first and second semiconductor chips 410 and 420. The TSV may connect the first and second semiconductor chips 410 and 420 to the electrodes inside the first and second semiconductor chips 410 and 420 through fine holes of the first and second semiconductor chips 410 and 420 to transmit electrical signals.

The plurality of first through electrodes 416 may vertically penetrate at least a portion of the first substrate to electrically connect the plurality of first front connection pads 412 to the plurality of first rear connection pads 414.

The plurality of second through electrodes 426 may vertically penetrate at least a portion of the second substrate to electrically connect the plurality of second front connection pads 422 to the plurality of second rear connection pads 424. The plurality of second through electrodes 426 may be electrically connected to the plurality of first through electrodes 416. The plurality of redistribution top pads 250 of the plurality of redistribution line patterns 222 may be electrically connected to the plurality of first front connection pads 412 of the first semiconductor chip 410.

A plurality of first chip connection terminals 418 may be attached to the plurality of first front connection pads 412 of the first semiconductor chip 410. The plurality of first chip connection terminals 418 may be disposed between the plurality of first front connection pads 412 of the first semiconductor chip 410 and the redistribution pattern 220 of the interposer 200, such as the redistribution top pad 250, to electrically connect the interposer 200 to the first semiconductor chip 410.

A plurality of second chip connection terminals 428 may be attached to the plurality of second front connection pads 422 of the second semiconductor chip 420. The plurality of second chip connection terminals 428 may be disposed between the plurality of first rear connection pads 414 of the first semiconductor chip 410 and the plurality of second front connection pads 422 of the second semiconductor chip 420, and the second rear connection pad 424 to electrically connect the first semiconductor chip 410 to the second semiconductor chip 420. As a result, the first semiconductor chip 410 and the plurality of second semiconductor chips 420 may be electrically connected to each other.

In some embodiments, an uppermost second semiconductor chip 420H, which is located farthest from the first semiconductor chip 410 (e.g., in the Z direction), among the plurality of second semiconductor chips 420, may not include the second rear connection pad 424 and the second through electrode 426. In an embodiment, the thickness of the uppermost second semiconductor chip 420H, which is located farthest from the first semiconductor chip 410, may be greater than that of each of the other second semiconductor chips 420.

In an embodiment, the first and second chip connection terminals 418 and 428 may be attached to the first and second semiconductor chips 410 and 420 after under-bump metallization (UBM) formation on the first and second semiconductor chips 410 and 420 through vacuum plating or electroplating. A UBM layer may facilitate adhesion between the first and second semiconductor chips 410 and 420 and the first and second chip connection terminals 418 and 428.

An insulating adhesive layer may be between the first semiconductor chip 410 and the second semiconductor chip 420. In an embodiment, the insulating adhesive layer may include a non-conductive film (NCF), a non-conductive paste (NCP), an insulating polymer, or an epoxy resin. However, embodiments of the present inventive concept are not necessarily limited thereto. The insulating adhesive layer may fill a gap between the first semiconductor chip 410 and each of the plurality of second semiconductor chips 420 while surrounding the first and second chip connection terminals 418 and 428.

In the semiconductor package 10 according to an embodiment, the passive device unit 300, and the first connection bump 242 and the second connection bump 244 of the interposer 200 may be separated from one another in the first and second horizontal directions (e.g., the X and Y directions) on the package base substrate 100. When viewed in a plan view, the plurality of passive device units 300 may surround the plurality of first connection bumps 242. As described above, when viewed in the plan view, the plurality of first connection bumps 242 may surround the plurality of second connection bumps 244.

The first connection bump 242 and the power terminal 320 of the passive device unit 300 may be connected to a potential plate. As described above, the potential plate may be referred to as the power plane PP. Thus, the first connection bump 242, which is a dummy bump, and the power terminal 320 of the passive device unit 300 may be electrically and directly connected to each other, thus increasing the power integrity (PI) of the semiconductor package 10 according to an embodiment.

A general semiconductor package may minimize a horizontal separation distance between a passive device unit and an interposer to increase the efficiency of the passive device unit. However, due to a physical limitation, there may be a minimum horizontal separation distance between the passive device unit and the interposer. For example, a distance between the passive device unit and the interposer may be substantially the same as a distance between a power terminal of the passive device unit and the interposer.

Additionally, the general semiconductor package may electrically connect the passive device unit with a second connection bump of the interposer. In connection between the passive device unit and the second connection bump, to avoid electrical connection to a first connection bump, a structure of a power plane may be relatively complex.

The semiconductor package 10 according to an embodiment of the present inventive concept may electrically and directly connect the first connection bump 242 to the power terminal 320 of the passive device unit 300 to reduce the length of the power plane PP. The power inductance of the semiconductor package 10 may be relatively reduced by relatively simplifying the structure of the power plane PP. The power plane PP may be a power path.

While it is shown in FIG. 1 that the first connection bump 242 and the power terminal 320 of the passive device unit 300 are electrically connected, embodiments of the present inventive concept are not necessarily limited thereto. For example, in an embodiment the first connection bump 242 may be electrically connected to the ground 330 of the passive device unit 300 as opposed to the power terminal 320.

In the semiconductor package 10 according to an embodiment, a distance between the passive device unit 300 and the interposer 200 may be in a range of about 1 mm to about 2 mm. As described above, the distance between the passive device unit 300 and the interposer 200 may be substantially the same as a distance between the power terminal 320 of the passive device unit 300 and the interposer 200. In an embodiment in which the distance between the passive device unit 300 and the interposer 200 is relatively reduced, the power inductance of the semiconductor package 10 may be relatively reduced.

Additionally, by increasing the number of power planes PP included in one semiconductor package 10, the number of power paths of the first stacked chip unit 400 and the passive device unit 300 may be relatively increased and the power inductance of the power package 10 may be relatively reduced.

Figure 2A:
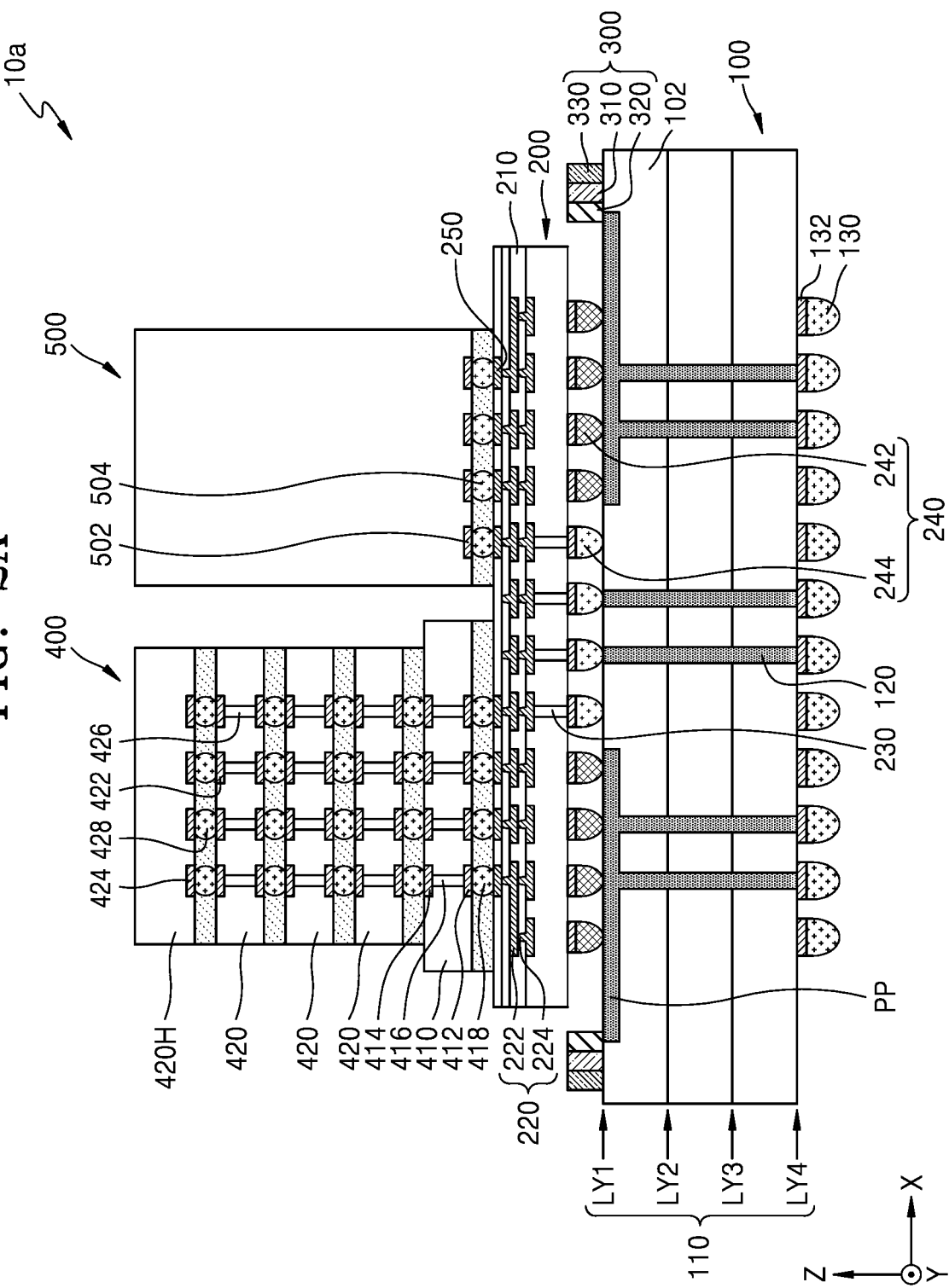
FIGS. 2A through 2C are cross-sectional views of various semiconductor packages, according to embodiments of the present inventive concept.
Figure 2B:
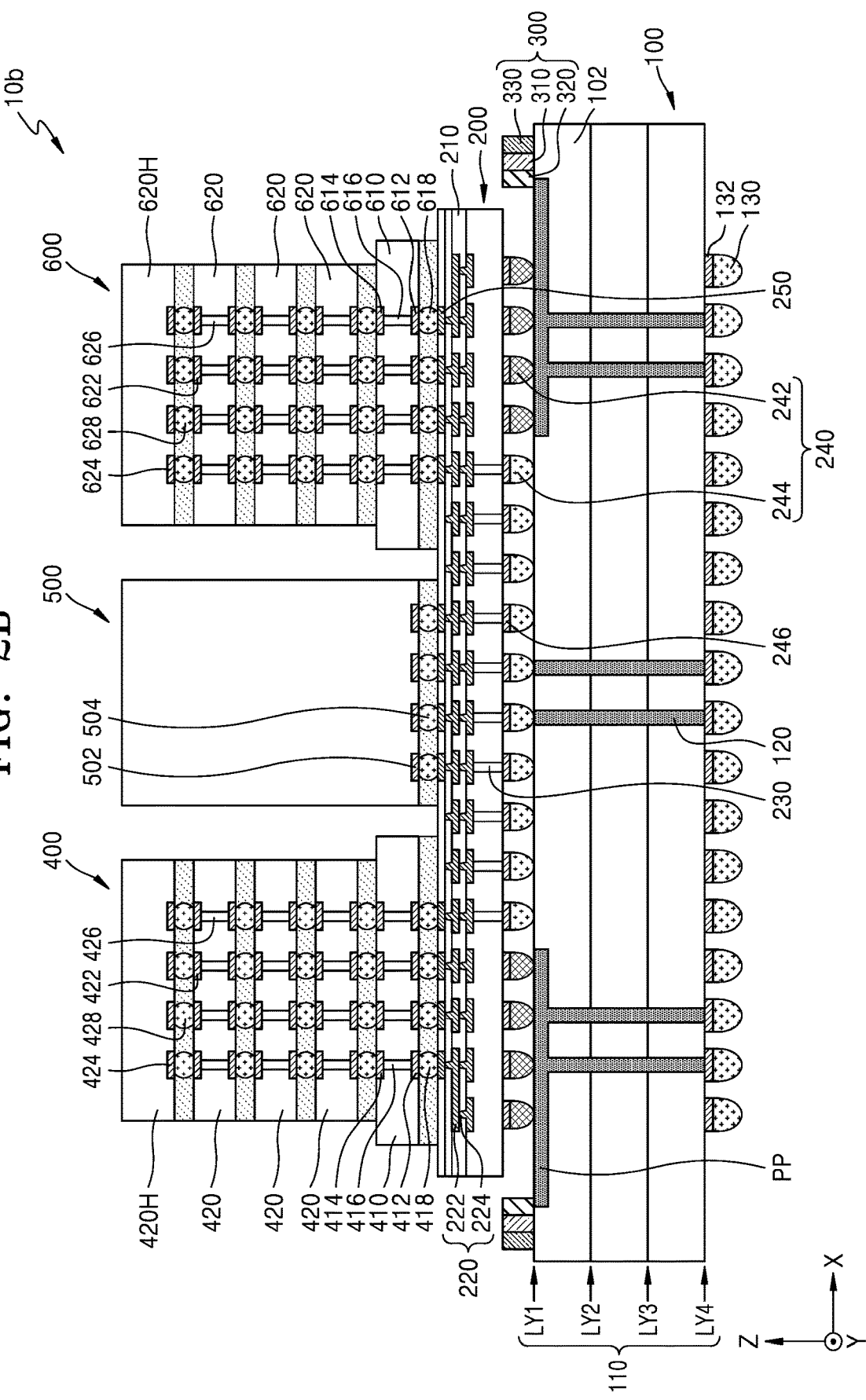
Figure 2C:
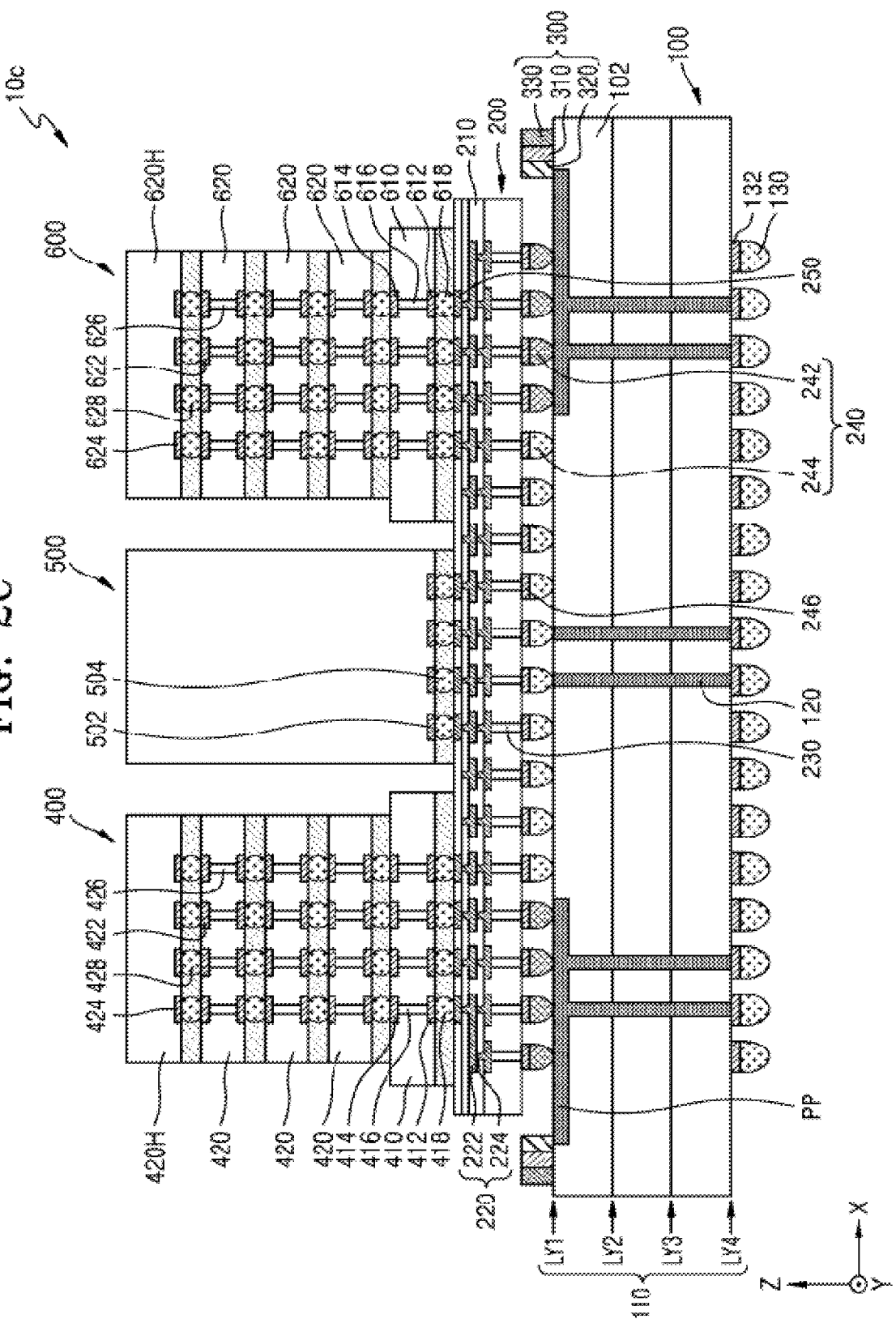

FIGS. 2A through 2C are cross-sectional views of structures of various semiconductor packages 10a, 10b, and 10c, according to embodiments of the present inventive concept.

Referring to FIGS. 2A through 2C, the semiconductor packages 10a, 10b, and 10c may include the first stacked chip unit 400, the second stacked chip unit 500, and/or the third stacked chip unit 600. The first stacked chip unit 400 may be substantially the same as the first stacked chip unit 400 shown in FIG. 1.

The first stacked chip unit 400 and the second stacked chip unit 500 may be arranged to be spaced apart from each other in the first and/or second horizontal directions (e.g., the X and/or Y directions) on the interposer 200. The third stacked chip unit 600 may be arranged apart from each of the first stacked chip unit 400 and the second stacked chip unit 500 in the first and/or second horizontal directions (the X and/or Y directions) on the interposer 200.

In an embodiment, the second stacked chip unit 500 may be a system-on-chip (SoC). For example, the SoC may be an application specific integrated circuit (ASIC). In an embodiment, the SoC may include a plurality of third semiconductor chips. Each of the plurality of third semiconductor chips may be arranged to be spaced apart from each other on a horizontal plane (e.g., the X and/or Y directions).

Each of the plurality of third semiconductor chips may include a third substrate, a plurality of third front connection pads, a plurality of third rear connection pads, a plurality of third through electrodes, and a third chip connection terminal.

The third substrate may be approximately the same as the first and second substrates. The plurality of third through electrodes may vertically penetrate at least a portion of the third substrate to electrically connect the plurality of third front connection pads to the plurality of third rear connection pads. The plurality of redistribution top pads 250 of the plurality of redistribution line patterns 222 of the interposer 200 may be electrically connected to the plurality of third front connection pads of the third semiconductor chip.

The SoC may be a chip on which complex function blocks performing various functions are implemented, and a standard cell according to an embodiment of the present inventive concept may be included in respective function blocks of the SoC, thereby achieving the SoC with a reduced area and a high-reliability function.

In an embodiment, the SoC may include a modem, a display controller, a memory, an external memory controller, a central processing unit (CPU), a transaction unit, a power management integrated circuit (PMIC), and a graphics processing unit (GPU), and the respective function blocks of the SoC may communicate with one another through a system bus.

The CPU capable of controlling the operation of the SoC overall may control operations of the other function blocks. The modem may demodulate a signal received from the outside of the SoC, or modulate a signal generated inside the SoC and transmit the modulated signal to the outside. In an embodiment, the external memory controller may control an operation of transmitting and receiving data to and from an external memory device connected to the SoC. For example, a program and/or data stored in the external memory device may be provided to the CPU or the GPU under control of the external memory controller. The GPU may execute program instructions related to graphics processing. The GPU may receive graphic data through the external memory controller, and transmit the graphic data processed by the GPU to the outside of the SoC through the external memory controller. A transaction unit may monitor data transaction of respective function blocks, and the PMIC may control power supplied to each function block under control of the transaction unit. By integrating component blocks of the SoC, integrated blocks may be referred to as ASIC devices.

The semiconductor packages 10b and 10c may include the third stacked chip unit 600 including a fourth semiconductor chip 610 and a plurality of fifth semiconductor chips 620. The third stacked chip unit 600 may be substantially the same as the first stacked chip unit 400 shown in FIG. 1. For example, the fourth semiconductor chip 610 may be substantially the same as the first semiconductor chip 410 shown in FIG. 1, and the fifth semiconductor chip 620 may be substantially the same as the second semiconductor chip 420 shown in FIG. 1.

The fourth semiconductor chip 610 may include a fourth substrate, a plurality of fourth front connection pads 612, a plurality of fourth rear connection pads 614, a plurality of fourth through electrodes 616, and a fourth chip connection terminal 618. The fifth semiconductor chip 620 may include a fifth substrate, a plurality of fifth front connection pads 622, a plurality of fifth rear connection pads 624, a plurality of fifth through electrodes 626, and a fifth chip connection terminal 628.

The fourth and fifth substrates may be approximately the same as the first and second substrates, and the fourth and fifth front and rear connection pads 612, 614, 622, and 624 may be approximately the same as the first and second front and rear connection pads 412, 414, 422, and 424.

The plurality of fourth through electrodes 616 may vertically penetrate at least a portion of the fourth substrate to electrically connect the plurality of fourth front connection pads 612 to the plurality of fourth rear connection pads 614. The plurality of redistribution top pads 250 of the plurality of redistribution line patterns 222 of the interposer 200 may be electrically connected to the plurality of fourth front connection pads 612 of the fourth semiconductor chip 610.

The plurality of fifth through electrodes 626 may vertically penetrate at least a portion of the fifth substrate to electrically connect the plurality of fifth front connection pads 622 to the plurality of fourth rear connection pads 614. The plurality of fifth through electrodes 626 may be electrically connected to the plurality of fourth through electrodes 616. For example, the fourth semiconductor chip 610 and the plurality of fifth semiconductor chips 620 may be electrically connected to each other. The second connection bump 244 of the interposer 200 and the fifth semiconductor chip 620 may be electrically connected to each other.

A plurality of second chip connection terminals 628 may be attached to the plurality of fifth front connection pads 622 of the fifth semiconductor chip 620. The plurality of fifth chip connection terminals 628 may be between the plurality of fourth rear connection pads 614 of the fourth semiconductor chip 610 and the plurality of fifth front connection pads 622 of the fifth semiconductor chip 620, and the fifth rear connection pad 624 to electrically connect the fourth semiconductor chip 610 to the fifth semiconductor chip 620.

In some embodiments, an uppermost fifth semiconductor chip 620H, which is located farthest from the fourth semiconductor chip 610 (e.g., in the Z direction), among the plurality of fifth semiconductor chips 620, may not include the fifth rear connection pad 624 and the fifth through electrode 626. In an embodiment, the thickness of the uppermost fifth semiconductor chip 620H, which is located farthest from the fourth semiconductor chip 610, may be greater than that of each of the other fifth semiconductor chips 620.

An insulating adhesive layer may be disposed between the fourth semiconductor chip 610 and the fifth semiconductor chip 620. In an embodiment, the insulating adhesive layer may include an NCF, an NCP, an insulating polymer, or an epoxy resin. However, embodiments of the present inventive concept are not necessarily limited thereto. The insulating adhesive layer may fill a gap between the fourth semiconductor chip 610 and each of the plurality of fifth semiconductor chips 620 while surrounding the fourth and fifth chip connection terminals 618 and 628.

Referring to FIGS. 2B and 2C, the semiconductor packages 10b and 10c according to an embodiment may include two HBM devices and one ASIC device. However, embodiments of the present inventive concept are not necessarily limited thereto, and the number of HBM devices and ASIC devices included in the semiconductor package 10 may be variously modified.

Referring to FIG. 2C, the first connection bump 242 and the redistribution pattern 220 may be electrically connected to each other through the interposer through electrode 230. For example, some of the interposer through electrodes 230 may not be located on the same vertical plane as the first connection bump 242. At least one interposer through electrode 230 may overlap the first connection bump 242 in a vertical direction parallel to a thickness direction of the package substrate 100 (e.g., the Z direction). For example, the dummy bump may be electrically connected to the first stacked chip unit 400, the second stacked chip unit 500, or the third stacked chip unit 600 through the interposer through electrode 230.

Figure 3:
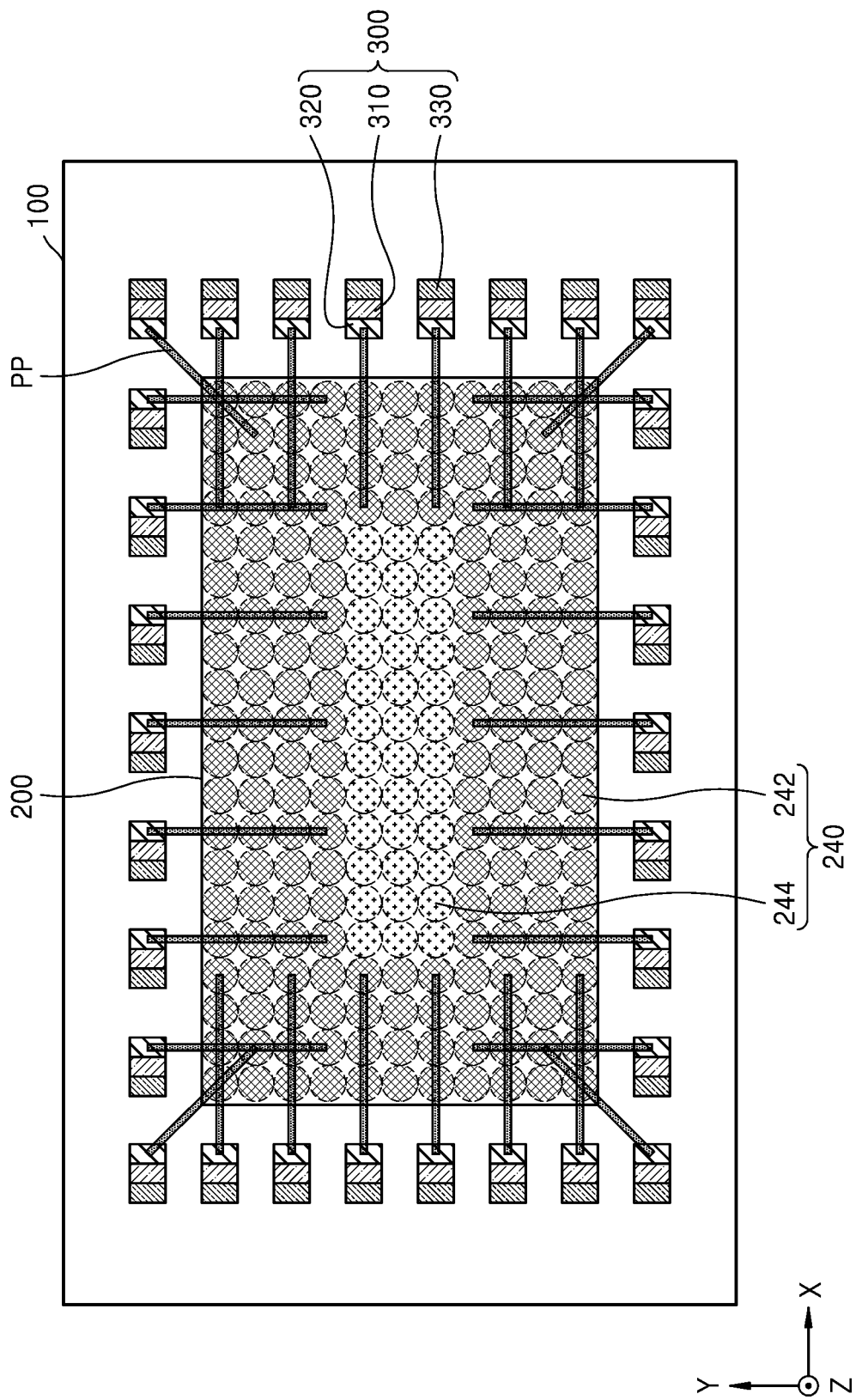
FIG. 3 is a plan view of a semiconductor package according to an embodiment of the present inventive concept.

FIG. 3 is a plan view of the semiconductor package 10 according to an embodiment of the present inventive concept.

Referring to FIG. 3, the interposer 200 and the passive device unit 300 may be arranged on the package base substrate 100, and the power terminal 320 of the passive device unit 300 and the first connection bump 242 of the interposer 200 may be connected to each other through the potential plate. The power plate may be referred to as the power plane PP.

As described above, as the length of the power plane PP is reduced and the structure of the power plate PP is simplified, the reliability of the semiconductor package 10 according to the current embodiment may be increased.

In an embodiment, the second connection bump 244 may be arranged in a matrix form. For example, as shown in FIG. 3 the second connection bump 244 may be arranged on a bottom surface of the interposer 200 in a matrix form having a plurality of columns (e.g., extending in the Y direction) and a plurality of rows (e.g., extending in the X direction). The first connection bump 242 may be arranged along an edge of a region where the second connection bump 244 is arranged (e.g., an edge in the X or Y direction). The first connection bump 242 is illustrated as being located along each of the edges of the region where the second connection bump 244 is arranged, but may also be arranged along one through three edges of the region where the second connection bump 244 is arranged. As described above, in an embodiment, four through six first connection bumps 242 may be arranged in the first or second horizontal direction (the X or Y direction) between a side of the interposer 200 and a side of an inner space defined by the second connection bump 244. However, embodiments of the present inventive concept are not necessarily limited thereto and the number of first and second connection bumps 242 and 244 included in one semiconductor package 10 may be variously changed.

In the plurality of passive device units 300, the power terminal 320 may be arranged relatively close to the interposer 200.

Figure 4:
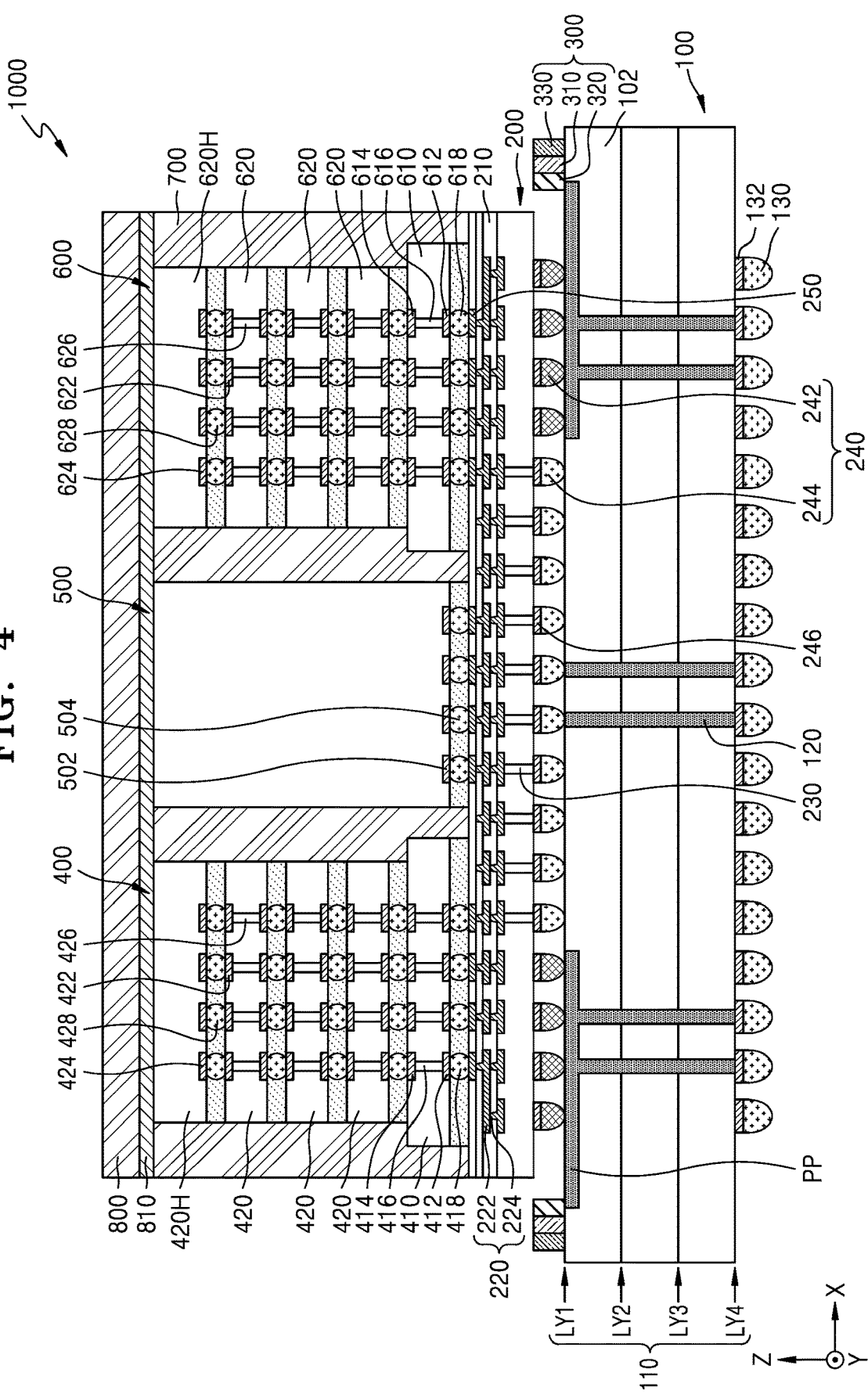
FIG. 4 is a cross-sectional view of a semiconductor package, according to an embodiment of the present inventive concept.

FIG. 4 is a cross-sectional view of a semiconductor package 1000, according to an embodiment of the present inventive concept.

Referring to FIGS. 1 and 4 together, the semiconductor package 1000 may include the package base substrate 100, the interposer 200, the passive device unit 300, the first through third stacked chip units 400, 500, and 600, a molding layer 700, and a heat dissipation structure 800.

The package base substrate 100, the interposer 200, the passive device unit 300, and the first through third stacked chip units 400, 500, and 600 may be approximately similar to these elements shown in FIGS. 1 to 3, and thus will not be described at this time. Top surfaces of the first through third stacked chip units 400, 500, and 600 may be located on the same plane.

The molding layer 700 may cover sides of the first to third stacked chip units 400, 500, and 600 from the top surface of the interposer 200. The molding layer 700 may protect the interposer 200 and the first and second stacked chip units 400 and 500.

A bottom surface of the molding layer 700 may be located on substantially the same plane (e.g., in the Z direction) as a top surface of the interposer 200, and a top surface of the molding layer 700 may be located on the same plane as the top surfaces of the respective first through third stacked chip units 400, 500, and 600 and a side surface of the molding layer 700 may be located on the same plane as a side surface of the interposer 200.

In an embodiment, the molding layer 700 may include an epoxy molding compound (EMC). However, embodiments of the present inventive concept are not necessarily limited thereto and the molding layer 700 may include various materials such as an epoxy-based material, a thermo-curable material, a thermoplastic material, an ultraviolet (UV) treatment material, etc.

The semiconductor package 1000 may include the heat dissipation structure 800 on the molding layer 700. The heat dissipation structure 800 may include a semiconductor material. For example, in an embodiment the heat dissipation structure 800 may include Si. However, embodiments of the present inventive concept are not necessarily limited thereto. For example, in an embodiment the heat dissipation structure 800 may include a semiconductor element such as Ge, or a compound semiconductor such as SiC, GaAs, InAs, and InP. For example, the heat dissipation structure 800 may include the same material as the first substrate.

The heat dissipation structure 800 may be formed of a material having a higher thermal conductivity than that of each of the first to fifth semiconductor chips 410, 420, 610, and 620. For example, the heat dissipation structure 800 may include Cu. For example, the heat dissipation structure 800 may include electroplating Cu. In an embodiment, electroplating may include forming metal coating on the heat dissipation structure 800 through electrolysis.

The heat dissipation structure 800 may include a plurality of layers. The plurality of layers may include the same one material, or may include different materials. The material of the heat dissipation structure 800 may not be limited to Cu. For example, the heat dissipation structure 800 may include a metal having good thermal conductivity. For example, in an embodiment the heat dissipation structure 800 may include metals such as nickel (Ni), gold (Au), silver (Ag), Al, W, Ti, Ta, In, Mo, Mn, Co. Sn, Mg, Re, Be, Ga, Ru, etc., or an alloy thereof.

The molding layer 700 and the heat dissipation structure 800 may be adhered to each other by an adhesive layer 810. The adhesive layer 810 may include a thermal interface material (TIM). A bottom surface of the adhesive layer 810 may be located on substantially the same plane as the top surface of each of the first to third stacked chip units 400, 500, and 600 and the top surface of the molding layer 700. The top surface of the adhesive layer 810 may be located on substantially the same plane (e.g., in the Z direction) as the bottom surface of the heat dissipation structure 800.

Although the semiconductor package 1000 according to an embodiment of the present inventive concept is shown as having a 2.5-dimensional stacked structure, embodiments of the present inventive concept are not necessarily limited thereto.

The semiconductor package 1000 may be a lower semiconductor package or an upper semiconductor package constituting the semiconductor package of a package on package (PoP) type.

The semiconductor package 1000 may be the three-dimensional (3D) structure semiconductor package. The 3D structure semiconductor package may reduce a distance between semiconductor chips by vertically stacking several semiconductor chips that are the same as or different from each other. The semiconductor chips may have respective through electrodes, thereby shortening a time taken for data transmission to other semiconductor chips. The 3D structure semiconductor package may freely arrange various types of semiconductor chips, thereby increasing a speed of data processing between the semiconductor chips.

According to an embodiment of the present inventive concept, the semiconductor package 1000 may be a wafer level package (WLP) and may be a fan-out wafer level package (FWLP) or a fan-in wafer level package (FIWLP) where a package connection terminal or an external connection pad is outside a region of the semiconductor chip or inside the region of the semiconductor chip.

For example, in an embodiment the semiconductor package 1000 may be a chip last fan out semiconductor package in which after the interposer 200 or the semiconductor substrate is formed, at least one semiconductor chip is mounted on the interposer 200 or the semiconductor substrate. However, embodiments of the present inventive concept are not limited thereto. For example, in an embodiment, the semiconductor package 1000 may be a chip-first package structure where at least one semiconductor chip is mounted on a tape, the periphery of the semiconductor chip is surrounded with a molding layer, and the interposer 200 or the semiconductor substrate is connected to the semiconductor chip. In some embodiments, the semiconductor package 1000 may be a fan-out panel level package (FOPLP).

For example, the semiconductor package 1000 may include a plurality of semiconductor chips, and the semiconductor package 1000 may be a system-in-package (SIP) in which the plurality of semiconductor chips of different types are electrically connected to each other to operate as a single system.

While the present inventive concept has been particularly shown and described with reference to embodiments thereof, it will be understood that various changes in form and details may be made therein without departing from the spirit and scope thereof.

What is claimed is:

1. A semiconductor package comprising:
a package base substrate including a potential plate;
an interposer arranged on the package base substrate and comprising at least one interposer through electrode, at least one first connection bump, and at least one second connection bump;
a first stacked chip unit arranged on the interposer and comprising a first semiconductor chip and at least one second semiconductor chip arranged on the first semiconductor chip; and
at least one passive device unit arranged on the package base substrate, the at least one passive device unit is spaced apart from the interposer in a horizontal direction parallel to an upper surface of the package base substrate,
wherein the at least one first connection bump is a dummy bump, and
the potential plate connects the at least one first connection bump and a power terminal of the at least one passive device unit to each other.

2. The semiconductor package of claim 1, wherein:
the package base substrate comprises a plurality of interconnection layers; and
the potential plate is arranged on an uppermost interconnection layer among the plurality of interconnection layers.

3. The semiconductor package of claim 1, wherein:
each of the at least one first connection bump and the at least one second connection bump are provided in plural; and
in a plan view, a plurality of first connection bumps surrounds a plurality of second connection bumps.

4. The semiconductor package of claim 1, wherein:
each of the at least one passive device unit and the at least one first connection bump is provided in plural; and
in a plan view, the plurality of passive device units surround the plurality of first connection bumps.

5. The semiconductor package of claim 1, wherein the at least one first connection bump and a power terminal of the at least one passive device unit are electrically connected to each other.

6. The semiconductor package of claim 1, wherein:
the first semiconductor chip comprises a buffer chip that controls the second semiconductor chip; and
the second semiconductor chip comprises a memory cell chip.

7. The semiconductor package of claim 1, wherein the at least one passive device unit comprises a capacitor.

8. The semiconductor package of claim 1, wherein none of the at least one interposer through electrodes overlap the at least one first connection bump in a vertical direction parallel to a thickness direction of the package base substrate.

9. The semiconductor package of claim 1, wherein some of the at least one interposer through electrodes overlap the at least one first connection bump in a vertical direction parallel to a thickness direction of the package base substrate.

10. A semiconductor package comprising:
a package base substrate including a potential plate;
an interposer arranged on the package base substrate and comprising at least one interposer through electrode, at least one first connection bump, and at least one second connection bump;
a first stacked chip unit arranged on the interposer and comprising a first semiconductor chip and at least one second semiconductor chip arranged on the first semiconductor chip;
a second stacked chip unit arranged on the interposer and comprising at least one third semiconductor chip arranged to be spaced apart from the first stacked chip unit in a horizontal direction parallel to an upper surface of the package base substrate; and
a plurality of passive device units arranged on the package base substrate and arranged to be spaced apart from the first stacked chip unit and the second stacked chip unit in the horizontal direction,
wherein the interposer comprises a plurality of interposer through electrodes that vertically penetrate the interposer,
the at least one first connection bump is a dummy bump,
in a plan view, the plurality of passive device units surround the at least one first connection bump, and
the potential plate connects the at least one first connection bump and a power terminal of the plurality of passive device units to each other.

11. The semiconductor package of claim 10, wherein:
the package base substrate comprises a plurality of interconnection layers; and
the potential plate is arranged on an uppermost interconnection layer among the plurality of interconnection layers, and is arranged on a single interconnection layer.

12. The semiconductor package of claim 10, wherein:
the first semiconductor chip comprises a buffer chip that controls the second semiconductor chip;
the second semiconductor chip comprises a memory cell chip; and
the third semiconductor chip comprises a memory cell chip and a logic chip.

13. A semiconductor package comprising:
a package base substrate comprising a plurality of interconnection layers;

an interposer arranged on the package base substrate and comprising a plurality of interposer through electrodes, a plurality of first connection bumps, and a plurality of second connection bumps;

a first stacked chip unit arranged on the interposer and comprising a first semiconductor chip and at least one second semiconductor chip arranged on the first semiconductor chip;

a second stacked chip unit arranged on the interposer and comprising at least one third semiconductor chip arranged to be spaced apart from the first stacked chip unit in a horizontal direction; and a plurality of passive device units arranged on the package base substrate and arranged to be spaced apart from the first stacked chip unit and the second stacked chip unit in the horizontal direction, wherein the plurality of interposer through electrodes and the plurality of second connection bumps are electrically connected to each other, each of the plurality of first connection bumps is a dummy bump, the first semiconductor chip comprises a buffer chip that controls the second semiconductor chip, the at least one second semiconductor chip comprises a memory cell chip, the at least one third semiconductor chip comprises a memory cell chip and a logic chip, each of the plurality of passive device units comprises a capacitor, in a plan view, the plurality of passive device units surrounds the plurality of first connection bumps, the plurality of first connection bumps and the plurality of passive device units are connected to each other through a potential plate of the package base substrate, the potential plate is arranged on an uppermost interconnection layer among the plurality of interconnection layers, the potential plate is arranged on a single interconnection layer, and the potential plate comprises a power path.

14. The semiconductor package of claim 13, further comprising:

a third stacked chip unit arranged on the interposer, the third stacked chip unit is arranged to be spaced apart from the first stacked chip unit and the second stacked chip unit in the horizontal direction, the third stacked chip unit includes a fourth semiconductor chip and at least one fifth semiconductor chip arranged on the fourth semiconductor chip.

15. The semiconductor package of claim 13, wherein:

the plurality of second connection bumps is arranged on a bottom surface of the interposer to form a column and a row; and in a vertical cross-sectional view, a number of the plurality of first connection bumps arranged in a first horizontal direction or a second horizontal direction between a side of a space defined by the plurality of second connection bumps and a side of the interposer is in a range of about 4 to about 6.

16. The semiconductor package of claim 13, wherein a thickness of the uppermost interconnection layer is in a range of about 5 μm to about 20 μm.

17. The semiconductor package of claim 13, wherein a diameter of each of the plurality of first connection bumps is in a range of about 10 μm to about 100 μm.

18. The semiconductor package of claim 13, wherein the capacitor comprises a decoupling capacitor that electrically connects a power terminal to a ground.

19. The semiconductor package of claim 13, wherein a distance between the interposer and the plurality of passive device units is in a range of about 1 mm to about 2 mm.

20. The semiconductor package of claim 13, wherein some of the plurality of interposer through electrodes overlap at least one of the plurality of first connection bumps in a vertical direction parallel to a thickness direction of the package base substrate.

* * * * *